United States Patent
Bogumil et al.

(10) Patent No.: US 6,253,333 B1
(45) Date of Patent: Jun. 26, 2001

(54) APPARATUS AND METHOD FOR TESTING PROGRAMMABLE DELAYS

(75) Inventors: Stanley J. Bogumil, Endwell; Charles E. Boice, Endicott; Frederic G. Webster, Binghamton; Robert L. Woodard, Newark Valley, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/046,284

(22) Filed: Mar. 23, 1998

(51) Int. Cl.[7] ........................................ G06F 1/04
(52) U.S. Cl. ................................................ 713/503
(58) Field of Search .................... 713/503, 401, 713/400; 714/814, 815, 42

(56) References Cited

U.S. PATENT DOCUMENTS

| | | | |
|---|---|---|---|
| 5,063,576 | * 11/1991 | Eguchil | 375/111 |
| 5,426,772 | * 6/1995 | Brady | 395/550 |
| 5,917,760 | * 6/1999 | Millar | 365/194 |
| 5,946,712 | * 8/1999 | Lu et al. | 711/167 |
| 5,953,284 | * 9/1999 | Baker | 365/233 |
| 5,978,929 | * 11/1999 | Covino et al. | 713/503 |

* cited by examiner

*Primary Examiner*—William Grant
*Assistant Examiner*—Ronald D Hartman, Jr.
(74) *Attorney, Agent, or Firm*—Scully, Scott, Murphy & Presser; John R. Pivnichny

(57) ABSTRACT

Automatic generation of a timed delay for a timing clock signal input to an electronic device having a time critical circuit receiving address, data, and control signals at a first time interval and performing data storage and data output operations at subsequent second time intervals as determined by the timing clock signal input thereto. The time delay is generated by combination of a first control device for determining a timing condition of the time critical circuit in accordance with data output results corresponding to a first data storage operation performed by the time critical circuit; and, a second control circuit for automatically adjusting the input of the timing clock signal in time with respect to the first time interval in accordance with the data output results. Adjustment of the timing clock signal delay for subsequent data storage operations optimizes time critical circuit performance for the electronic device.

14 Claims, 2 Drawing Sheets

APPARATUS AND METHOD FOR TESTING PROGRAMMABLE DELAYS

BACKGROUND OF THE INVENTION

1. Field of the Invention

The present invention relates generally to VLSI modules and testing thereof, and particularly, to an apparatus and testing methodology for automatically adjusting timing delays of time critical signals present in VLSI modules and printed circuit board units.

2. Discussion of the Prior Art

In the development of VLSI products, careful consideration is paid to external interfaces. These interfaces are typically glueless and are required to support an array of different modules with different timing requirements. The problem lies in the generation of one set of timing delays for external interfaces that handles all timing conditions. The timing delays are for timing critical signals, such as synchronous clocks. One can optimize for nominal timings, worst case, or best case, but, as is often the case, silicon processes inherently drift between nominal and the two extremes. Because of this inherent drift the timing design needs to handle multiple timing cases.

Currently, once the nominal, best and worst case delays are identified, a user typically decides and manually programs the selected delay to use for optimum circuit operation.

It would be highly desirable to provide an automatic process that tests the delays between the VLSI module, printed circuit board (PCB), and external memory module as a unit and, further that automatically adjusts the delay of time critical signals input to time sensitive circuits without operator intervention.

SUMMARY OF THE INVENTION

It is an object of the present invention to provide a technique for automatically testing devices having time critical inputs.

It is a further object of the present invention to provide an automatic testing technique for devices having time critical inputs, which technique provides for the automatic generation of delays for the time critical inputs to ensure that the device has been optimized for the particular application, operating environment, etc.

A further object is to provide a testing technique that automatically selects delays of timing signals to time critical inputs of an external device, e.g., memory module, based on verification of the printed-circuit board connections, wiring lengths, environmental variables, and silicon process drift.

In accordance with the principles of the invention, there is provided a method and apparatus for automatically generating a delay for a timing clock signal input to a time critical circuit of an electronic device, the time critical circuit capable of receiving address, data, and control signals at a first time interval and performing data storage and data output operations at a second time interval determined by the timing clock signal input thereto, and including: a first control circuit device for determining a timing condition of the time critical circuit in accordance with data output results corresponding to a first data storage operation in the time critical circuit; and, a second control circuit for automatically adjusting the input of the timing clock signal in time with respect to the first time interval in accordance with the results; wherein the adjusted timing clock signal is thereafter input to the time critical circuit for subsequent data storage operations to optimum time critical circuit performance.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

In the description of the invention, reference is herein made to the following example of a video encoder chip (e.g., MPEG-2 compliant) having a functional block comprising a test device that interfaces with one or more external time critical circuits, e.g., synchronous DRAM ("SDRAM"), SRAM, or like time critical memory devices/registers. It should be understood that the principles and concepts for testing programmed delays of time critical signals, as described herein, are readily applicable to any types of circuits that are governed by time critical signals and which data may be read from or written to.

Figure 1:
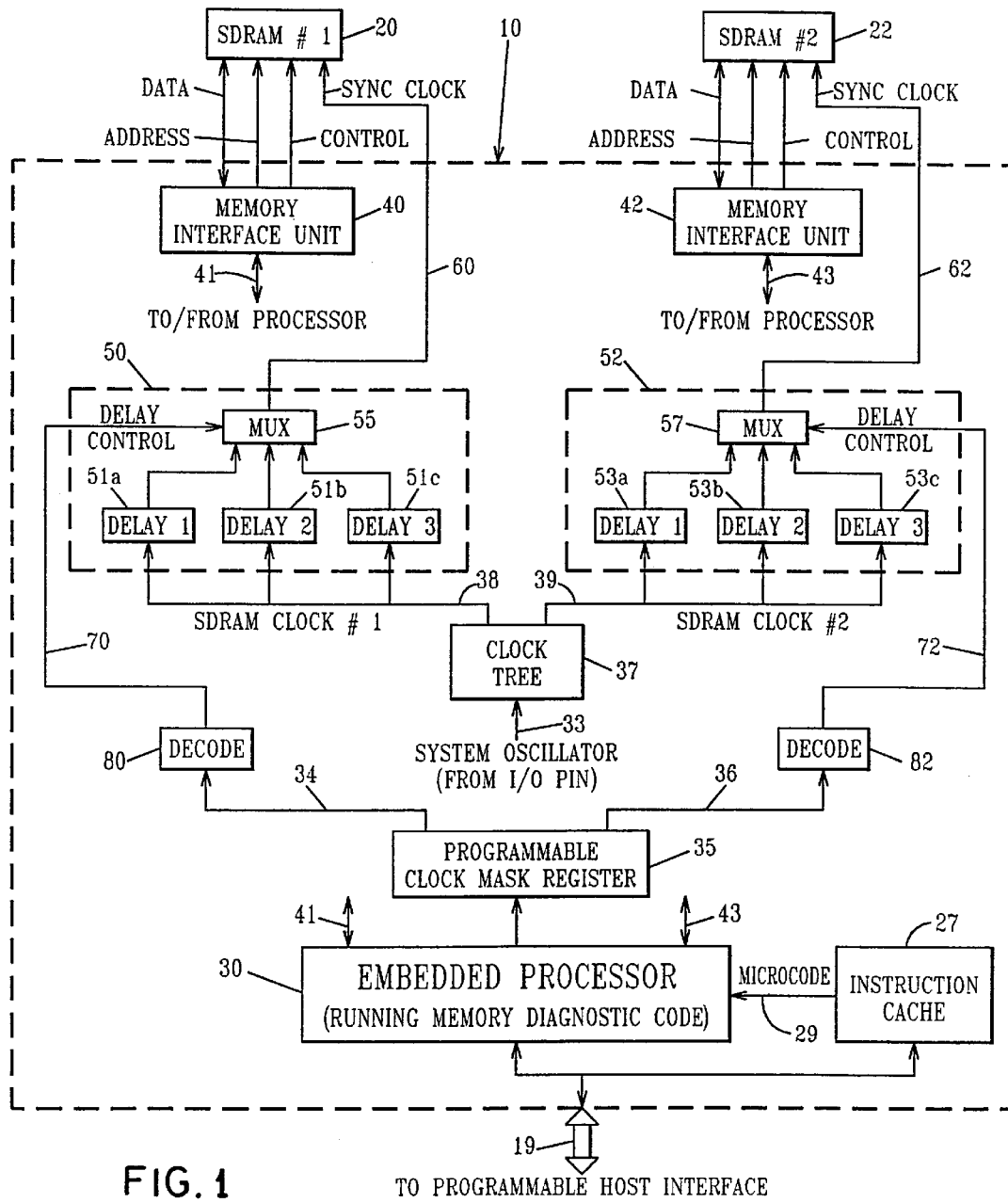
FIG. 1 illustrates the programmable delay testing apparatus 10 of the invention.

As shown in FIG. 1, the test device 10 implementing the methodology of the invention is preferably processor based and includes all functional blocks necessary to test delays inherent in a time critical circuit, such as SDRAM memory units 20 and 22. Specifically, the device 10 tests the timing characteristics/specifications of an SDRAM unit having: 1) a synchronous clock input which enables all Read/Write operations; and, 2) Address/Data/Control input signals which are synchronized, e.g., to the 'positive-going' edge of the synchronous clock, and are required to arrive 'x' nanoseconds before the edge of the clock, i.e., referred to as the 'Setup' time. These Address/Data/Control signals are also required to be "held" 'x' nanoseconds beyond the 'positive-going' edge of the clock input. SDRAMs also have a 'Read Access' time specification where the SDRAM will present data on its output Data Port, 'x' nanoseconds after the 'positive-going' edge of the synchronous clock, during a Read Cycle. It should be understood that the time critical circuit may be configured to perform Read/Write operations upon detection of a 'negative-going' edge or voltage level of the synchronous clock input.

Although the SDRAM unit timing delays are dependent on many variables, for purposes of explanation, the test device 10 of the invention has been programmed to compensate for delays dependent upon three main variables: 1) the speed of the video Encoder module; 2) the speed of the SDRAM module; and 3) the length of the Printed Circuit Board Wiring between Encoder and SDRAM modules (not shown). Module speed, in turn, is dependent on the following main variables: 1) variations in the silicon processes implemented in manufacturing the module; 2) the temperature at any of the on-chip circuit junctions; and 3) the chip supply voltage. From these factors three distinct 'Timing Cases' are defined: 1) a NOMINAL case consisting of a 'nominal' silicon process range, 'nominal' Chip temperature/voltage, and assumption of an 'average' length of PCB wiring between modules; 2) a WORST CASE consisting of a 'slow' silicon process, 'high' Chip junction temperature, 'low' Chip supply voltage, and assumption of 'long' lengths of PCB wiring between modules; and, 3) a BEST CASE consisting of a 'fast' silicon process, 'low' Chip junction temperature, 'high' Chip Supply voltage, and assumption of 'short' lengths of PCB wiring between modules.

The automated test method of the invention adjusts for Nominal/Worst/Best Case Encoder/SDRAM Interface timings by automatically selecting an appropriate 'delay' for the respective SDRAM synchronous clock, which is generated internal to the chip. The 'delay' is selected internally, by microcode, by means of setting a programmable Clock Mask register 35, based on the results of a microcode driven Memory Diagnostic test that is stored as instructions in an instruction cache 27, as will be explained. It should be understood that in other embodiments, programmed logic arrays or even simple logic circuits may be implemented in the test device for selecting and generating delays used in the test methodology as will be explained.

As shown in FIG. 1, the test unit 10 comprises an embedded microprocessor or similar control device 30 which interfaces with the programmable clock mask register device 35 that provides an "n"-bit time delay code necessary for setting the time delay of the unit to be tested in accordance with a programmed test instruction, and additionally interfaces with one or more interface units such as memory interface units 40 and 42 that provide data, address and control signals at specific time instants for the respective SDRAM memory unit 20, 22 to be tested. Preferably, the "n"-bit time delay code is 16-bits long, however, other bit code lengths may be used without detracting from the scope of the invention. As shown in FIG. 1, respective interface units 40 and 42 each receive the data, address and control signal information for its associated SDRAM circuit under test from the embedded processor 30 via respective bi-directional I/O lines 41 and 43. Preferably, the memory interface unit is a generic interface that may be slightly modified according to the particular temporary storage device being tested, e.g., SRAM, SDRAM, FIFO, etc. One skilled in the art will recognize that clock tree circuitry 37 will provide a synchronized clock signal to the memory interface circuit 40, 42 for enabling synchronized input of the address, data and control directly to the SDRAM circuit under test at specific time instances. In an alternative embodiment, the data, address and control signals may be input to the memory interface units from other control devices located in the video encoder or, may be input directly to the SDRAM unit to be tested. As will be explained, each memory interface unit 40, 42 and respective SDRAM unit 20, 22 will perform a data read/write from/to a respective SDRAM unit 20 and 22 with the data fed back via respective I/O lines 41 and 43 to the processor unit 30 running memory diagnostic code, for eventual determination of the optimum timing delay for the tested circuit, i.e., SDRAM memory unit 20, 22, under test. As shown in FIG. 1, the test device 10 is programmed in accordance with instructions received by a programmable host interface (not shown) via input lines 19.

Figure 3:
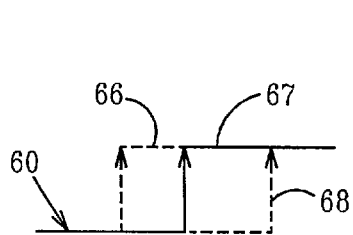
FIG. 3 illustrates the timing delay variations of a rising edge of a clock signal as programmed in accordance with the delay testing device of the invention.

Further shown in FIG. 1 is the clock generation portion of the test apparatus 10 including a clock tree circuit 37 for generating specific clock signals 38, 39 at a specified frequency that is a function of a system oscillator input 33. As known to skilled artisans, clock tree circuits such as circuit 37 contain the necessary fan-out and load control for enabling generation of the desired clock signals from a single oscillator input. Clock signals 38 and 39 are input to respective delay control circuits 50 and 52 and are processed to generate the synchronous clocks 60 and 62 for respective circuits 20 and 22 under test. Each delay control circuit 50, 52 receives the delay control input signal(s) from the programmable clock mask register device 35 via lines 70 and 72 after the mask has been decoded by respective bit decode devices 80 and 82. Specifically, as shown in FIG. 1 with respect to the delay control circuit 50, clock signal 38 is input to each of three delay circuits 51a, 51b and 51c which contain circuitry for providing three delayed clock input signals 38 to simulate the respective Nominal/Worst/Best Case test circuit behavior. Each of the three delay circuits 51a, 51b and 51c provide a respective clock signal delayed in time with respect to the clock signal 38 in a manner well-known to skilled artisans. Preferably, the delay circuits 51a–51c are designed to provide clock delays of any order of magnitude specific to the design of the circuit being tested. For the SDRAM units described herein, typical clock delays may range between the order of $10^{-1}$ to $10^1$ nanoseconds to simulate each of the herein described best case, worst case and nominal conditions. FIG. 3 illustrates a portion of a clock signal 60 rising edge input for each of three delay testing conditions: a clock signal 67 for the nominal case, a clock signal 68 for the worst case and a clock signal 66 for the best case condition. The delay code, which preferably is an n-bit programmed microcode instruction 29 as processed by processor 30, is input to the programmable clock mask register 35 which provides the n-bit instruction signal 34 specifying the particular circuit under test and the delay code therefor. This instruction signal 34 is input to decode block 80 which contains logic to decode the n-bit signal 34 and generate a corresponding "m"-bit delay control signal 70 that selects the appropriate delay of the clock input 60 depending upon the number of decodes that are required for the tested circuit. As shown in FIG. 1, the delay control signal 70 utilized in the invention is a 2-bit signal enabling a multiplexor unit 55 to generate at least one of three possible delayed clock input signals 60 from one of respective delay units 51a–51c. In this manner, the positive going edge of the clock signal 60 input to the SDRAM memory 20 is received in accordance with the specified delay of, e.g., x+/-y nanoseconds, with respect to the setup and hold times for the address data and control signals which are input to the SDRAM unit in accordance with the system timing of the programmed embedded processor 30.

It should be understood that the description provided herein is likewise applicable to the automatic testing of a plurality of SDRAM memory units, e.g., second SDRAM memory unit 22, in a sequential fashion.

Specifically, as shown in FIG. 1 with respect to the delay control circuit 52, clock signal 39 is input to each of three delay circuits 53a, 53b and 53c which contain circuitry for providing three delayed clock input signals 39 to simulate the respective Nominal/Worst/Best Case testing scenarios. Each of the three delay circuits 53a, 53b and 53c provide a respective clock signal delayed in time with respect to the clock signal 39. Preferably, the delay circuits 53a–53c are designed to provide realistic clock delays ranging between the order of $10^{-1}$ to $10^1$ nanoseconds to simulate either best case, worst case and nominal conditions, for the tested SDRAM circuits described herein. The delay code, which preferably is an "n"-bit programmed microcode instruction 29 stored in instruction cache 27 and processed by processor 30, is input to the programmable clock mask register 35 which provides the n-bit instruction signal 36 specifying the particular circuit under test and the delay code. This instruction signal 36 is input to decode block 82 which contains logic to decode the n-bit signal 36 and generate an "m"-bit delay control signal 72 that selects the delay of the clock input 62 depending upon the number of decodes that are required for the tested circuit. As shown in FIG. 1, the delay control signal 72 utilized in the invention is a 2-bit signal enabling a multiplexor unit 57 to generate only one delayed clock input signal 62 from one of three respective delay units 53a–53c. In this manner, the positive going edge of the clock signal 62 input to the SDRAM memory 22 is received in accordance with the specified delay of, e.g., 'x+/−y' nanoseconds, with respect to the receipt of address data and control signals which are input to the SDRAM unit in accordance with the system timing of the programmed embedded processor 30. It should be understood that decode circuits 80 and 82 may be designed as part of the delay control circuits 50 and 52.

Figure 2:
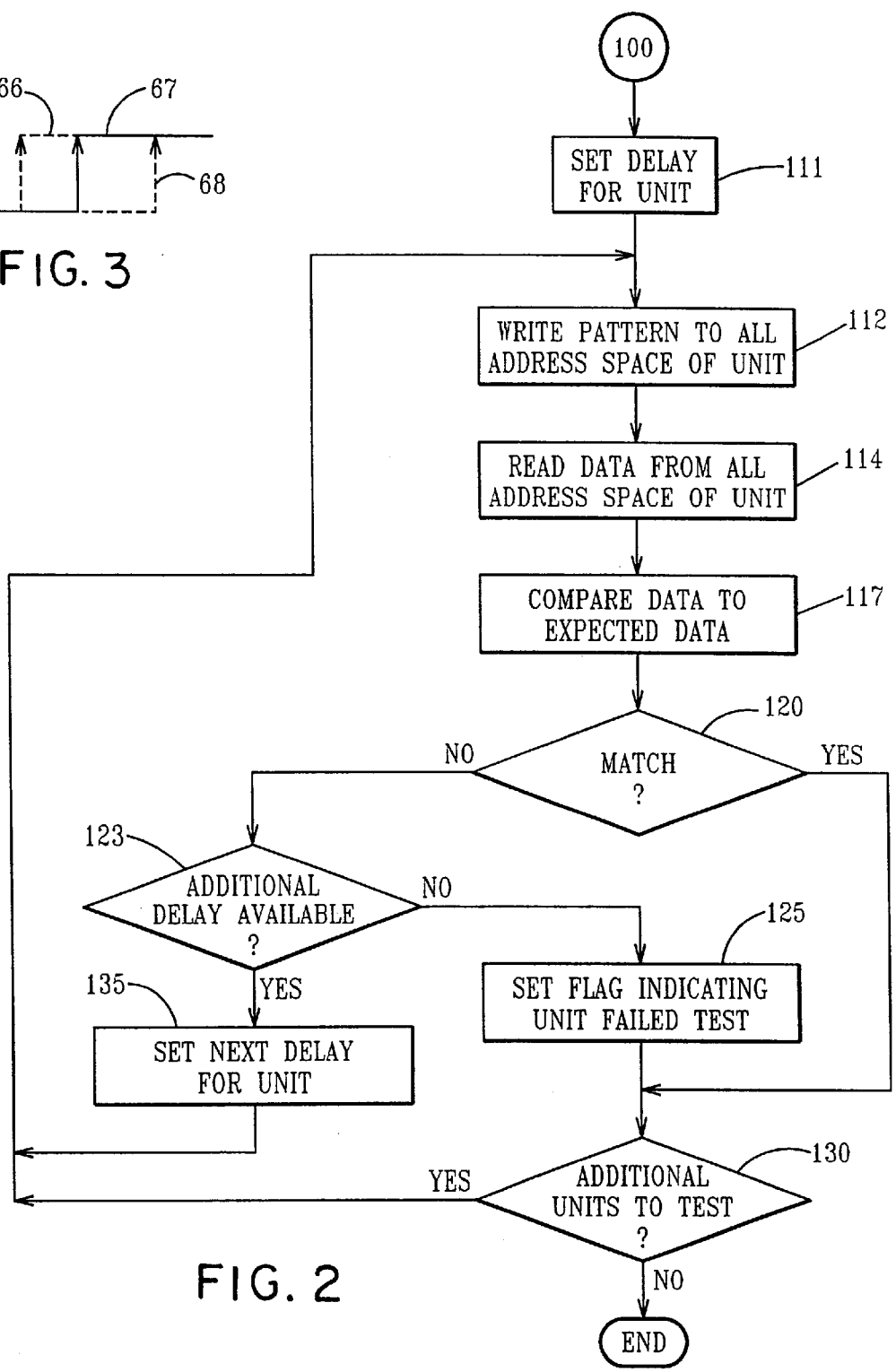
FIG. 2 is a block diagram depicting a memory diagnostic test for testing external SDRAM units according to the testing methodology of the invention.

Programmable delay testing is performed, for example, by performing a read operation of the data already written into the SDRAM unit. Specifically, the programmable delay testing operates under control of the programmed processor 30 running a Memory Diagnostic test 100 which is now described with respect to FIG. 2. In a first programmed step 111, a microcode instruction implemented in the VLSI chip sets the testing delay to a default (power up) delay which, for example, may simulate the nominal delay condition in accordance with test device of FIG. 1, and, at step 112, writes a first pattern of data to the address space of the memory circuit under test via address, data and control lines input from its associated memory interface unit. It is understood that the address and data signals have to be input to the external memory at a certain time with respect to an instance of the synchronous SDRAM clock input, i.e., a rising edge, falling edge, or a sensed level. Once the pattern has been written, the microcode instructs the memory interface unit to perform a memory read operation so as to verify that the data has been correctly written at the programmed operating speed (e.g., default speed), as indicated at step 114. Then, at step 117, a comparison is made between the data actually read and the expected data out of the memory unit tested, and, at step 120, a determination is made as to whether the output data matches the expected data. If the output data read does match the expected data, then the current delays are selected for the operational mode and the process proceeds to step 130 where a determination is made as to whether there are any additional units to test. If there are additional units to test, then the process proceeds to step 112 where the next data patterns are written to the address space of the unit under test and the process continues with the default delays set.

If at step 120 it is determined that there was no match between the output data and the expected data, indicating a timing delay problem at a particular address location of a particular test circuit, then, provided there is no more delays that could be tested, a flag indicating the tested unit module and the failed address location is set for subsequent diagnostic troubleshooting. As an example, if the SDRAM memory being tested is operable under fast conditions, as described herein, the initial default delays may tuned such that the data is presented later than the external memory requires it to be, so that it may miss the data, i.e., did not write it, or corrupted it, etc. Then, the process proceeds to step 123 where a decision is made as to whether an additional delay, e.g., a best case or worst case delay, can be set for the unit. If at step 123 it is determined that there is an additional delay that can be selected, then the process proceeds to step 135 where the next programmed delay for the unit is set. The process then repeats by proceeding to step 112 where the data input pattern is written to the address space of the unit and read again under programmed microcode control. Then, after writing and reading data (steps 112 and 114) the next comparison decision (step 117) is to test the next case delay. Implementing the test circuitry 10 (FIG. 1), if the delayed clock input, i.e., the positive going edges (FIG. 3) of the SDRAM clock input have moved in time for an amount such that there is enough time for setup and hold, i.e., enough time for the address and data to become stable and valid when it is presented to the SDRAM, then a match should present itself at step 120. Thus, the programmed delay for this iteration will become the delay of record for subsequent processing of data at this SDRAM chip. If, at step 123, there is no additional delays that can be tested for the current unit, then the process proceeds to step 125 where a flag is set to alert the user that the unit failed the test and that additional memory diagnostics should be initiated. The process then continues at step 130 to determine if there are any additional units to test and, particularly, continues until all read tests pass or all the delays have been exercised.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims. For example, the test unit may implement multiple processors which would enable parallel processing, i.e., testing, of multiple units concurrently, rather than sequentially.

Having thus described our invention, what we claim as new, and desire to secure by Letters Patent is:

1. An apparatus for automatically adjusting a synchronous timing clock signal for controlling data storage and retrieval operations in a time critical memory circuit interfaced with a memory control device, said control device and said time critical memory circuit operating at a required system clock rate specified for said control device, said apparatus comprising:

(a) means for providing address, data, and control signals for input to said time critical memory circuit and for accessing data actually stored in said time critical circuit;

(b) means for receiving data output signals of said time critical memory device based on previously input address, data, and control signals;

(c) means for determining a timing condition of said time critical memory circuit and said control device in accordance with said received data output signals; and, (d) means for automatically adjusting arrival of an edge of said synchronous timing clock signal in accordance with a determined timing condition, said means iteratively adjusting said synchronous timing clock signal in time with respect to the input of said address and data signals in said time critical memory circuit to thereby alter data setup and hold time of said time critical memory device for both memory read and write operations until a desired timing condition is met, said adjusted synchronous timing signal being thereafter input to said time critical memory device for continued operations at said required system rate to thereby preserve system integrity.

2. The apparatus as claimed in claim 1, wherein said timing clock signal is input to said time critical circuit in synchronization with an input of address and data signals to said time critical circuit by said providing means.

3. The apparatus as claimed in claim 1, wherein said means for determining a timing condition in said time critical circuit includes said means for accessing data actually stored in said time critical circuit after performing a data storage operation; and further comprising:

means for comparing said data available for input prior to said data storage operation with said actual data stored in said time critical circuit at said original clock instant to determine a time delay in said time critical circuit.

4. The apparatus as claimed in claim 1, wherein said original clock instant represents a default time delay for said time critical circuit, said default time delay representing a pre-defined nominal timing condition.

5. The apparatus as claimed in claim 1, wherein a said clock instant of said timing clock signal is one of a positive going clock pulse edge, a negative going clock pulse edge, and a detected clock pulse level.

6. The apparatus as claimed in claim 1, wherein said means for adjusting said time delay comprises:

processor means for receiving one or more programmed instructions; and means for decoding a received instruction and generating a command for said means for adjusting said timing clock signal.

7. The apparatus as claimed in claim 6, wherein said programmed instruction includes an indication of a delay for said timing clock signal in time.

8. The apparatus as claimed in claim 6, wherein said means for providing address, data, and control signals for input to said time critical circuit and for accessing data actually stored in said time critical circuit includes interface means in communication with said processor for receiving said address, data and control signals.

9. The apparatus as claimed in claim 1, wherein said timing condition represents one of a best case, nominal, and worst case time delay condition, said timing condition being influenced by one of manufacturing, operating, and environmental characteristics of said time critical circuit, or combinations thereof.

10. The apparatus as claimed in claim 9, wherein said operating characteristics including circuit junction temperature and power supply voltage supplied to said time critical circuit.

11. A method for automatically testing delays inherent in a time critical memory circuit capable of performing data storage operations in an electronic device, said memory circuit interfaced with a memory control device and operating at a required system clock rate specified for said control device, said apparatus comprising:

(a) providing address, data, and control signals for input to said time critical circuit;

(b) generating a timing clock signal for input to said time critical circuit, an instant of said timing clock signal enabling said time critical circuit to perform a said data storage operation at said default system rate;

(c) accessing data actually stored in said time critical circuit;

(d) comparing said data available for input prior to said data storage operation with actual data stored in said time critical circuit at said timing clock signal instant and determining if said data available for input prior to said data storage operation matches actual data stored in said time critical circuit;

(e) if a match is not determined, automatically adjusting the arrival of an edge of said timing clock signal in time with respect to time of input of said address and data signals in said time critical circuit to thereby alter data setup and hold time of said time critical memory device for both memory read and write operations, and repeating steps (a) through (e) with said automatically adjusted arrival of an edge of said timing clock signal input to said time critical circuit at step (b) until a predetermined condition of said time critical circuit exists, said predetermined condition including determination that a match exists; and (f) if a match is determined, inputting said time adjusted timing clock signal to said time critical circuit for each subsequent data storage operation performed by said time critical circuit at said required system rate, wherein said adjusting fine tunes the interface between said control circuit and memory device for continued operation at said required system clock rate to thereby preserve system integrity.

12. A method as claimed in claim 11, wherein said predetermined condition including determination that a match does not exist , said step (f) including the step of providing an indication to perform diagnostic testing of said time critical circuit.

13. A diagnostic apparatus for automatically adjusting a synchronous timing clock signal input to a time critical memory circuit of an electronic device, the time critical memory circuit interfaced with a memory control device for operation at a required system clock rate specified for said control device and capable of receiving address, data, and control signals and performing data storage and data output operations, said apparatus comprising:

processor means for generating instructions to enable said memory control device to write data to said time critical circuit during a data storage operation performed at a required system clock rate and; said processor means further generating instructions to enable reading of data during a data output operation and comparing actual output data by said time critical circuit against the data input during said data storage operation for determining a match condition;

a time delay circuit responsive to said processor for automatically adjusting an arrival time of an edge of said synchronous timing clock signal input to said time critical memory circuit when a match does not exist;

wherein said processor means iteratively initiates data storage and data output operations, automatic adjusting operations and comparing operations until a match condition exists, whereby, when a match condition exists, said time delay circuit enabling continued operation of said time critical memory circuit for both memory read and write operations, wherein said adjusting fine tunes the interface between said control circuit and memory device for continued operation at said required system clock rate and thereby preserve system integrity.

14. The apparatus as claimed in claim 13, wherein said data output operations performed are determined by one of a positive going clock pulse edge, a negative going clock pulse edge, or a detected clock pulse level of said input timing clock signal.

* * * * *